United States Patent

Hooper

(10) Patent No.: US 6,746,254 B2
(45) Date of Patent: Jun. 8, 2004

(54) SCREWLESS CIRCUIT BOARD ATTACHMENT

(75) Inventor: Paul Hooper, El Paso, TX (US)

(73) Assignee: Axxion Group Corporation, El Paso, TX (US)

( * ) Notice: Subject to any disclaimer, the term of this patent is extended or adjusted under 35 U.S.C. 154(b) by 12 days.

(21) Appl. No.: 09/927,672

(22) Filed: Aug. 10, 2001

(65) Prior Publication Data

US 2003/0031004 A1 Feb. 13, 2003

(51) Int. Cl.[7] ................................................ H01R 4/66
(52) U.S. Cl. .................................... 439/95; 174/138 G
(58) Field of Search ................. 439/92, 95; 174/138 G, 174/138 D; 361/758

(56) References Cited

U.S. PATENT DOCUMENTS

| | | | |
|---|---|---|---|
| 3,066,367 A | 12/1962 | Garman | 24/81 |
| 3,996,500 A | 12/1976 | Coules | 317/101 CC |
| 4,495,380 A | 1/1985 | Ryan et al. | 174/138 D |
| 4,688,131 A | 8/1987 | Noda et al. | 360/137 |
| 4,896,777 A | 1/1990 | Lewis | 211/41 |
| 5,262,923 A | 11/1993 | Batta et al. | 361/685 |
| 5,277,615 A | 1/1994 | Hastings et al. | 439/377 |
| 5,319,519 A | 6/1994 | Sheppard et al. | 361/685 |
| 5,332,306 A | 7/1994 | Babb et al. | 312/334.16 |
| 5,452,184 A | 9/1995 | Scholder et al. | 361/799 |
| 5,510,955 A | 4/1996 | Taesang | 361/685 |
| 5,587,889 A | 12/1996 | Sacherman | 361/809 |
| 5,595,501 A | 1/1997 | Ho | 439/377 |
| 5,599,080 A | 2/1997 | Ho | 312/334.7 |
| 5,682,291 A | 10/1997 | Jeffries et al. | 361/1.85 |
| 5,683,159 A | 11/1997 | Johnson | 312/334.7 |
| 5,734,557 A | 3/1998 | McAnally et al. | 361/727 |
| 5,801,920 A | 9/1998 | Lee | 361/685 |
| 5,806,949 A | 9/1998 | Johnson | 312/334.7 |
| 5,833,480 A | 11/1998 | Austin | 439/95 |
| 5,921,644 A | 7/1999 | Brunel et al. | 312/223.2 |
| 6,025,987 A | 2/2000 | Allirot et al. | 361/685 |
| 6,094,342 A | 7/2000 | Dague et al. | 361/685 |
| 6,124,552 A | 9/2000 | Boe | 174/135 |
| 6,130,817 A | 10/2000 | Flotho et al. | 361/685 |
| 6,470,556 B2 * | 10/2002 | Boe | 29/450 |

FOREIGN PATENT DOCUMENTS

| | | |
|---|---|---|
| CN | 0569-4811 | 4/2000 |
| JP | 406215553 A | 8/1994 |
| TW | 0569-4811 | 3/2000 |

* cited by examiner

*Primary Examiner*—Neil Abrams
*Assistant Examiner*—Phuong K T Dinh
(74) *Attorney, Agent, or Firm*—Gardere Wynne Sewell LLP; Kenneth T. Emanuelson

(57) ABSTRACT

A fastener for attaching a circuit board to a chassis has a head section for engaging the circuit board, a tail section for engaging the chassis, and a spring section to urge the head into engagement with the circuit board.

20 Claims, 7 Drawing Sheets

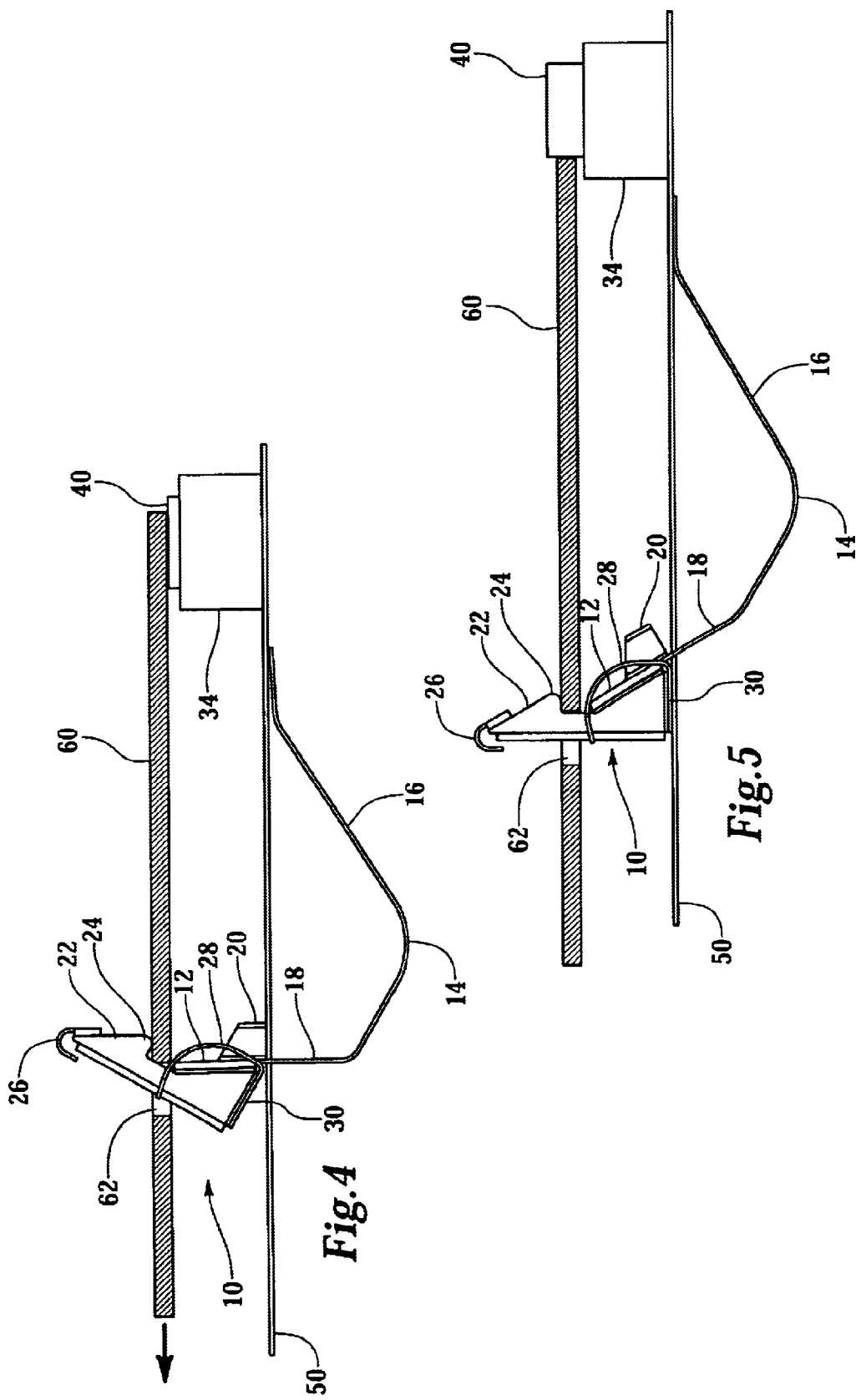

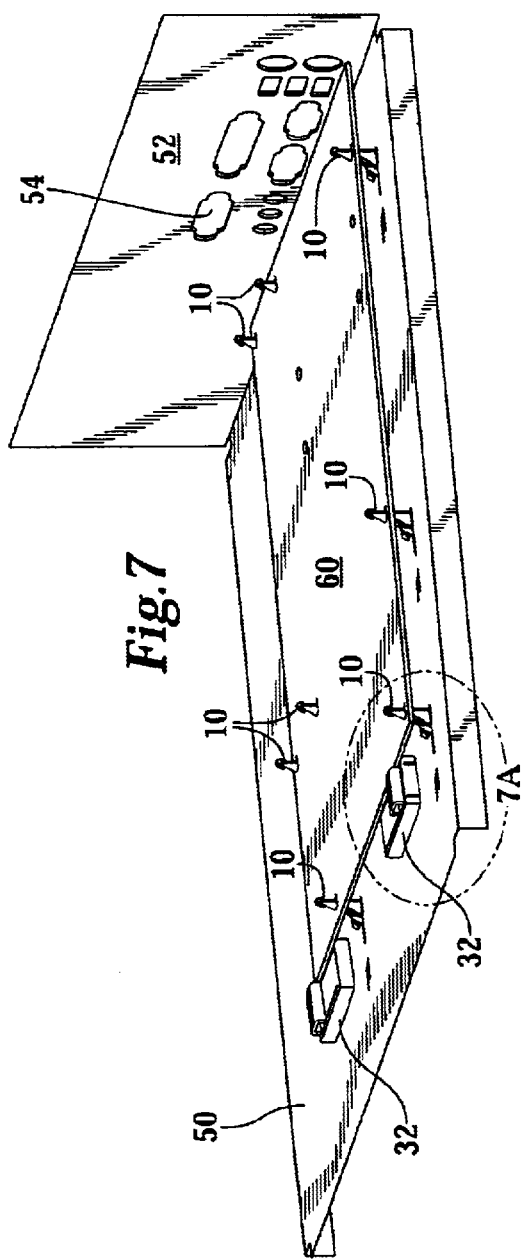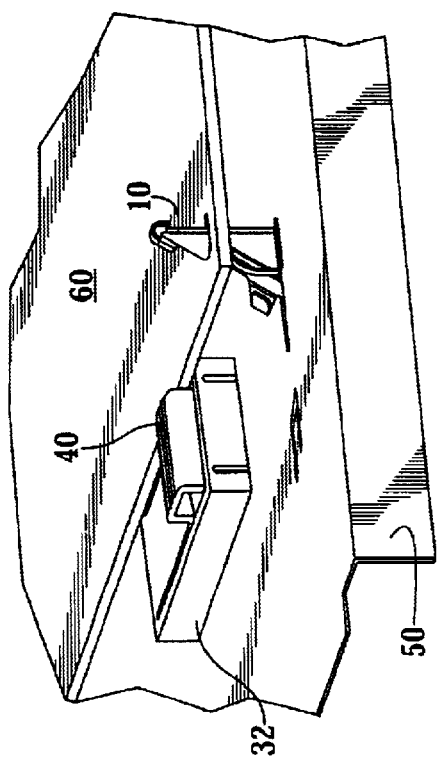

SCREWLESS CIRCUIT BOARD ATTACHMENT

FIELD OF THE INVENTION

The present invention relates to computers and computer manufacturing and, more particularly to, an apparatus, method and system to easily attach and electrically ground a circuit board to a computer chassis.

BACKGROUND OF THE INVENTION

Computer manufacturers rely primarily on large product volume to compete with other manufacturers in their industry. Consequently, manufacturing techniques must use efficiently components and labor to produce a competitive product. Each manufacturing step or component within the computer assembly adds production costs, which might otherwise contribute to profits. Attaching a circuit board to the chassis, for example, requires typically several components and multiple manufacturing steps.

The circuit board is usually attached to the chassis with screws through a standard pattern of screw holes. Each screw must be installed through the circuit board holes and into a threaded metal standoff. The standoff serves to attach and electrically ground the circuit board to the chassis when the screw is tightened. Unfortunately, installing repetitively each standoff and screw consumes valuable manufacturing time and increases the possibility of damage to the circuit board by the screw installation tools.

Screws also have an additional disadvantage when used for computer manufacturing because they are usually small and metallic. Small screws are difficult to capture and place within a computer assembly. Dropped screws may become lodged within circuitry on the circuit board. Because screws are usually metallic, a dropped screw has the potential to short circuit and damage the delicate circuitry on the circuit board.

Additionally, computer consumers often upgrade their own computers by replacing components within their existing chassis. Consumers often lack the proper tools and skill necessary to efficiently service their computer. Removing the old circuit board and replacing it with a new circuit board increases the possibility that the consumer will damage one or both circuit boards during the upgrade process. The possibility for damage may be especially appreciated considering that the circuit board is attached to the chassis with several tiny screws through holes that are located proximate vital computer circuitry. If the consumer's screwdriver slips, the resulting damage to the circuit board could be substantial.

It would, therefore, be desirable to have a fastener that does not require repetitive manufacturing steps to install the circuit board in the chassis. Additionally, there is a need for a fastening system that does not increase the number of components, such as screws, for example, in the computer assembly. Also, there is a need for fastening system that does not increase the likelihood that a consumer will damage the computer while performing upgrades.

SUMMARY OF THE INVENTION

According to one embodiment of the present invention, a fastener for attaching a circuit board to a chassis has a head section for engaging the circuit board, a tail section for engaging the chassis, and a spring section to urge the head into engagement with the circuit board is disclosed.

According to another embodiment of the present invention, a method for attaching a circuit board to a chassis includes the step of positioning one or more pivoting fasteners within the chassis is also disclosed. The pivoting fasteners have a head section, a tail section, and a spring section. The tail sections of the pivoting fasteners are connected to the chassis. One or more circuit board mounting holes are engaged with the head sections of the pivoting fasteners. The circuit board is then releasably locked to the chassis.

Another embodiment of the present invention is a system for attaching a circuit board to a chassis that has one or more pivoting fasteners connected to the chassis and a releasable locking circuit board retainer. The pivoting fasteners capture the circuit board through mounting holes in the circuit board. The circuit board retainer holds the circuit board against tension, which results from springs attached to the pivoting fasteners.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 4 is a side view of a fastener in an open position that depicts an embodiment of the present invention;

FIG. 5 is a side view of a fastener in a closed position that depicts an embodiment of the present invention;

FIG. 7 is a perspective sectional view of a computer chassis that depicts an embodiment of the present invention.

DETAILED DESCRIPTION OF THE INVENTION

Although making and using various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention, and do not delimit the scope of the invention.

Figure 1:
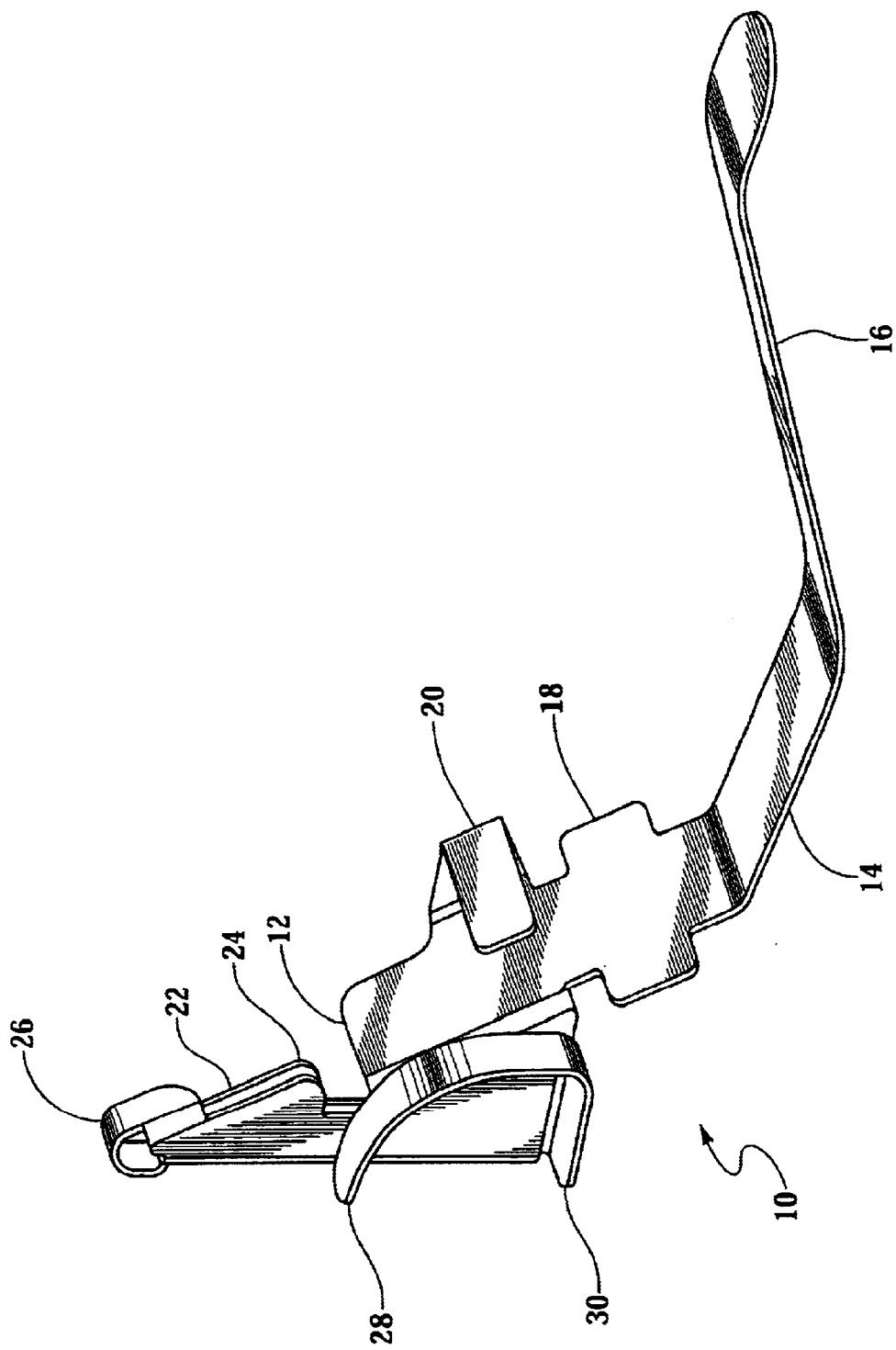
FIG. 1 is a perspective view of a fastener that depicts one embodiment of the present invention.

Referring to FIG. 1, a fastener 10 has a body 12. The body 12 has a tail 14, which may include a spring 16. The fastener 10 may be retained in a computer chassis (illustrated in FIG. 3) by inserting the tail 14 and the spring 16 into predetermined locations. The spring 16 may help retain and position the fastener 10 in an orientation that may facilitate installation of a circuit board (illustrated in FIGS. 4-8).

The material selected for the fastener 10 may enhance the spring constant of the spring 16. The fastener 10 may be fabricated from a single piece of die-stamped sheet steel, for example. The fastener 10 may also be molded plastic or another suitable material. If the fastener 10 is die-stamped sheet steel, it may be formed using a metal break or other manufacturing technique known by those having ordinary skill in the metal fabrication art. Forming the body 12 and the spring 16 from the same material may reduce costs and increase manufacturing efficiency. However, those having ordinary skill in the manufacturing art will appreciate that the body 12 and the spring 16 may be formed from dissimilar materials.

The spring 16 acts against the chassis through a fulcrum 18, which helps retain the fastener 10. A stop 20 also helps position the fastener 10 and prevents overtravel. The spring 16 urges the body 12 into an orientation that is generally offset from vertical. During assembly, the offset vertical orientation of body 12 aids in positioning the circuit board and provides resistance, which secures the circuit board.

A head 22 is connected to the body 12 to interface with the circuit board. The head 22 may have, for example, a hook 24 to help retain the circuit board and a guide 26 to aid in positioning the circuit board. The guide 26 may be shaped to reduce snagging of wires and other components within a computer assembly. Reducing or eliminating sharp edges on the guide 26 may also protect a technician or consumer who is manufacturing or servicing the computer assembly.

The fastener 10 may also include a grounding arm 28. The grounding arm 28 may serve to electrically ground the circuit board to the chassis. A foot 30 may electrically contact the chassis while the grounding arm 28 may be urged against a grounding contact on the circuit board in a spring-like relation.

Figure 2:
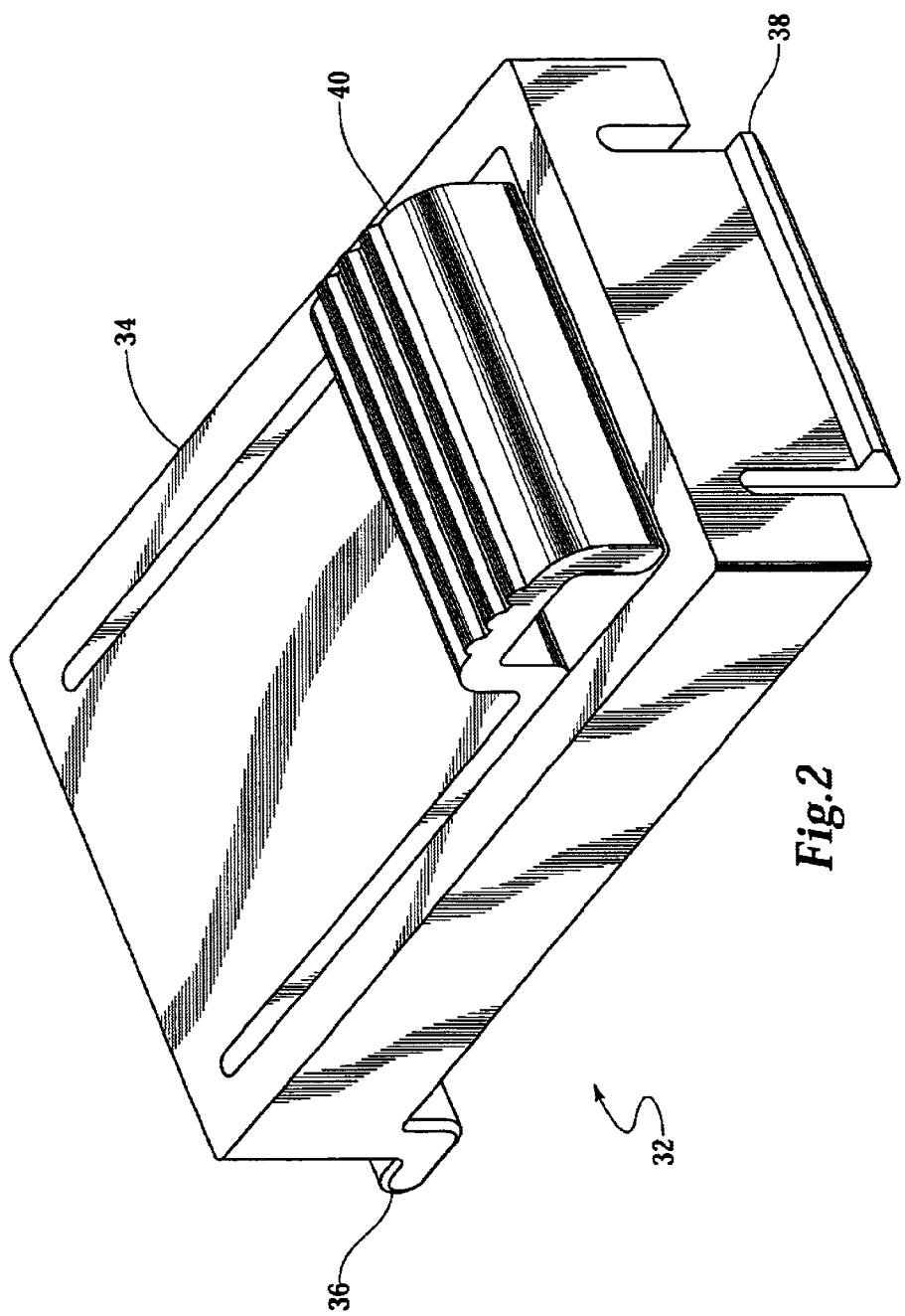
FIG. 2 is a perspective view of a retainer that depicts an embodiment of the present invention.

Turning now to FIG. 2, depicted is another embodiment in which a retainer 32 has a retainer body 34. A retainer foot 36 and a retainer tab 38 are attached to the retainer body 34 to secure the retainer 32 to predetermined locations on the chassis. A board retainer 40 attached to the retainer 32 may be constructed of a resilient material, which urges the board retainer 40 into retaining contact with the circuit board. Examples of resilient materials for retainer 32 may be made from mold injected plastic, die-stamped steel or machined aluminum, for example.

Figure 3:
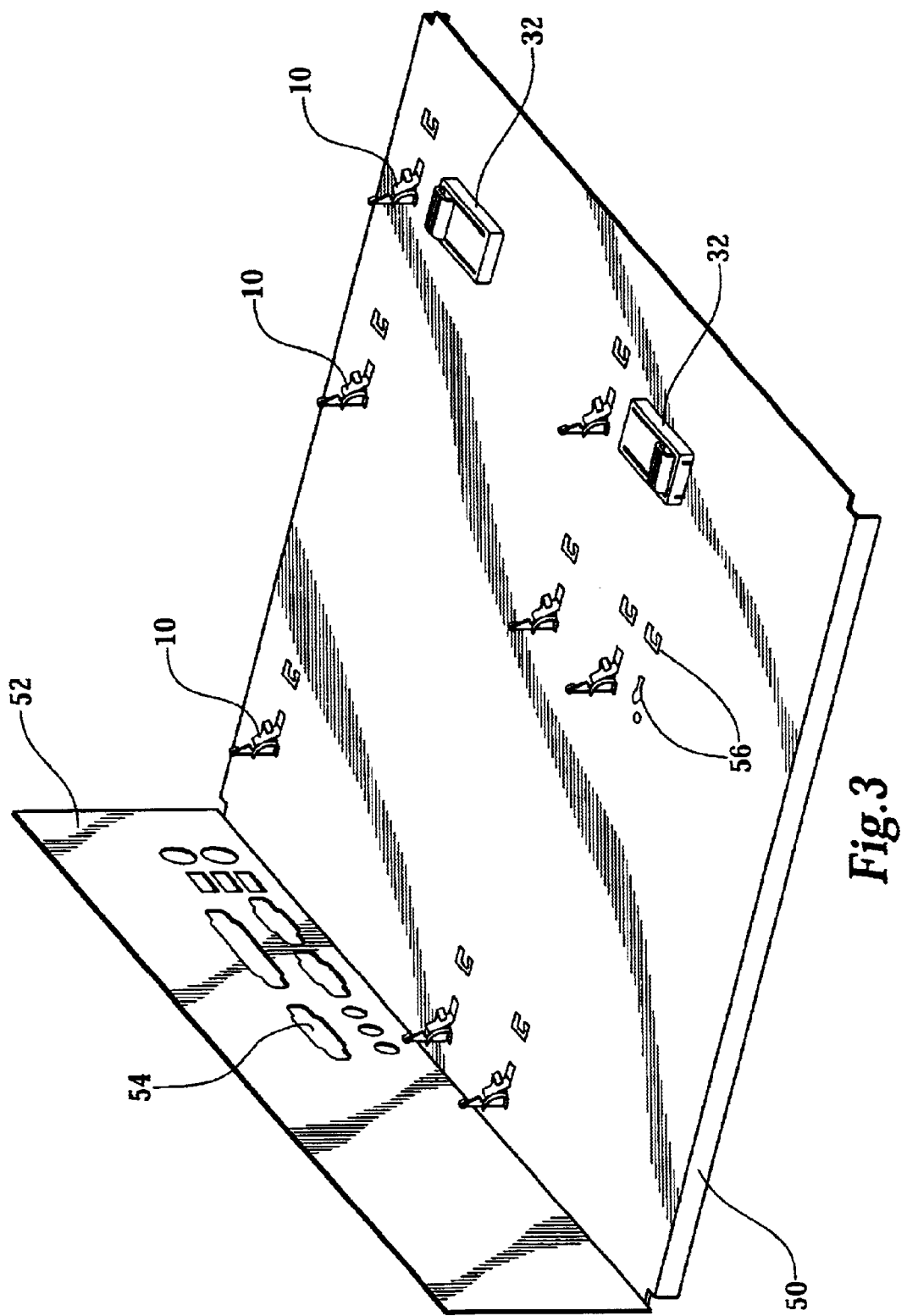
FIG. 3 is a perspective view of a computer chassis that depicts an embodiment of the present invention.

FIG. 3 depicts a chassis 50 having multiple fasteners 10 and retainers 32. The fasteners 10 and retainers 32 are installed on the chassis 50 at locating features 56. The locating features 56 may be die-stamped, drilled or machined into the chassis 50 at predetermined locations, which correspond to attachment points on the circuit board.

Multiple configurations of locating features 56 may be included on the chassis 50 to correspond to a variety of circuit boards. Consequently, the chassis 50 allows for versatile manufacturing processes. Different circuit boards may be easily attached to the chassis 50 by simply relocating the fasteners 10 or retainers 32 to correspond to a particular circuit board, hole or attachment point pattern. As a result, a single chassis 50 may be used to assemble multiple products having circuit boards of different sizes and shapes.

The chassis 50 may have a rear panel 52 that houses I/O slots 54. The I/O slots 54 may be aligned to the locating features 56, which, consequently, align the circuit board with the corresponding I/O slots 54. The I/O slots 54, for example, may be typically die-stamped into the rear panel 52 but may also be molded, drilled, machined, or laser-cut.

Figure 6:
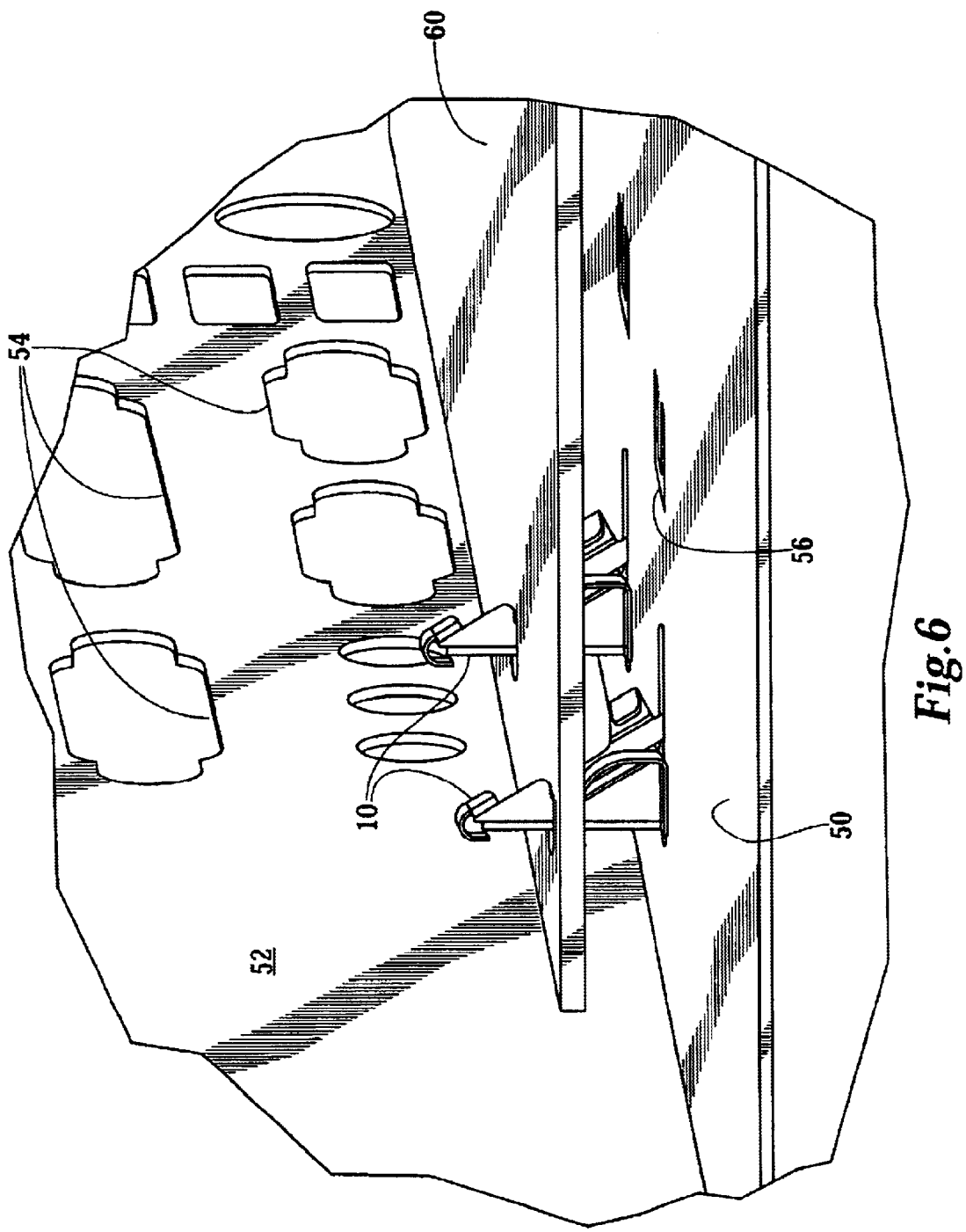
FIG. 6 is a perspective sectional view of a computer chassis that depicts an embodiment of the present invention.

Turning now to FIGS. 4-6, a detailed installation of a circuit board 60 is depicted. Specifically, FIG. 4 depicts the fastener 10 in an open position. The spring 16 urges the body 12 and the head 22 of the fastener 10 into an orientation that is generally offset from vertical. A hole 62 in the circuit board 60 is placed over the head 22 of the fastener 10. The guide 26 may prevent damage to the circuit board 60 as the hole 62 is placed over the head 22.

After the circuit board 60 is resting, generally, on the body 12 of the fastener 10, the circuit board 60 may be pushed toward the rear panel 52. The fastener 10 may pivot about fulcrum 18 as the circuit board 60 is moved into position. The hook 24 of the fastener 10 may restrict upward motion of the circuit board 60. The spring 16 may resist rearward movement of the circuit board 60 and will tend to urge the circuit board 60 away from the rear panel 52. However, the resistance of the spring 16 may act to hold the circuit board 60 against the retainer 32 (shown in FIG. 7). The tension of the spring 16 may locate the circuit board 60 and hold the circuit board 60 in position if the chassis 50 experiences environmental forces such as thermal expansion or impacts, for example.

FIG. 5 depicts the fastener 10 in the closed position. The foot 30 rests against the chassis 50 and may electrically ground the fastener 10 to the chassis 50. The foot 30 may also impart stability to the fastener 10 and structural support to the circuit board 60. The foot 30 may also stop the fastener 10 from pivoting beyond a desired orientation, which constrains movement and helps to precisely locate the circuit board 60 on the chassis 50.

As the fastener 10 pivots about fulcrum 18, the grounding arm 28 may be pushed into electrical contact with the circuit board 60. The grounding arm 30 may be formed of metal, for example, and have spring-like characteristics. As a result, the grounding arm 28 may urge the circuit board 60 against the hook 24, which may further secure the circuit board 60.

FIG. 6 depicts the circuit board 60 secured to the chassis 50 by the fasteners 10. The location of circuit board 60 may be determined, for example, according to the location of I/O slots 54 in the rear panel 52. Multiple locating features 56 may be pre-fabricated in the chassis 50 to accommodate circuit boards 60 of various sizes. Fasteners 10 may be inserted into locating features 56 that correspond to holes 62 in the circuit board 60. Fasteners 10 may be relocated easily to different locating features 56 if the circuit board 60 is changed or upgraded.

Figure 8:
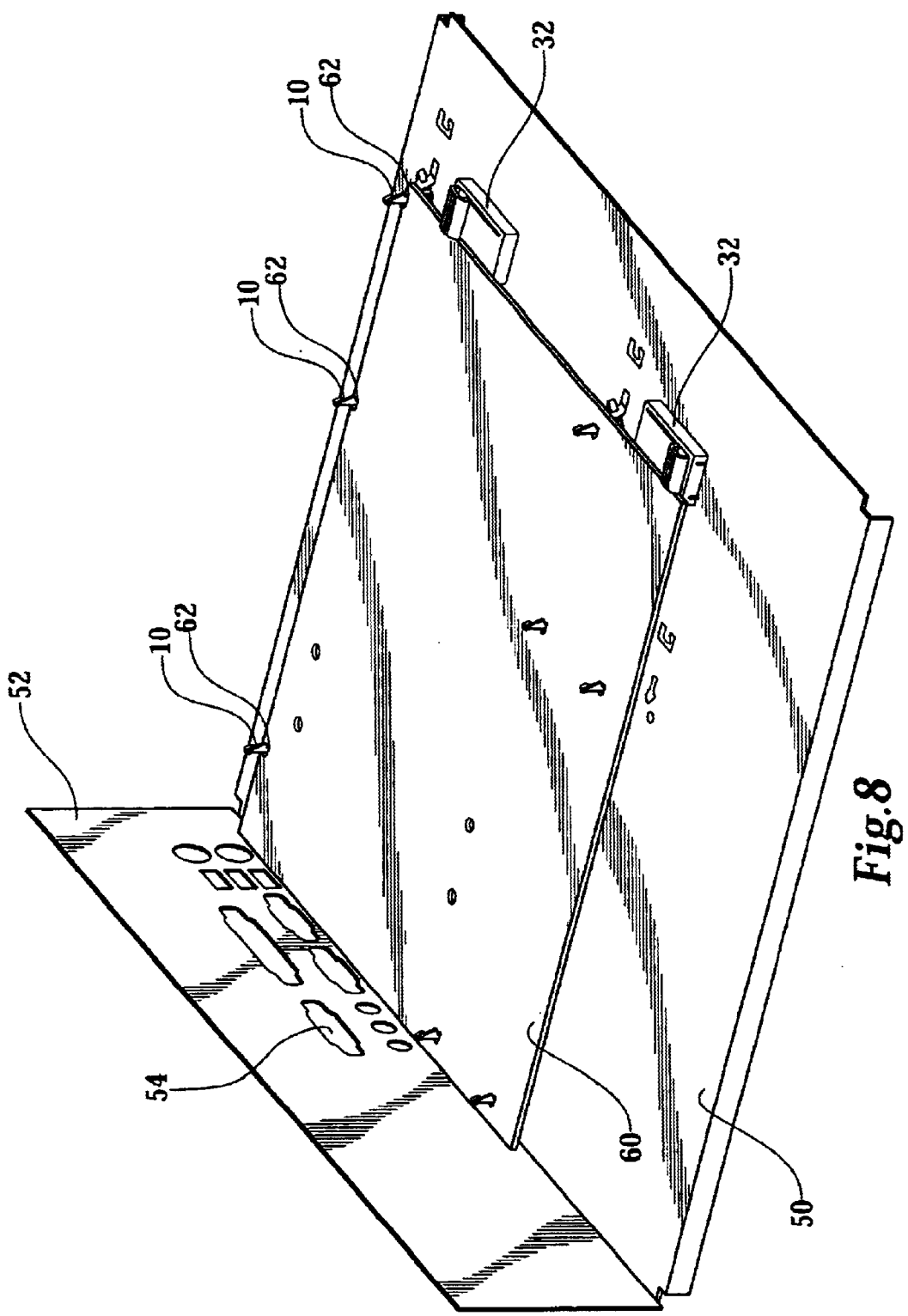
FIG. 8 is a perspective view of a computer chassis that depicts an embodiment of the present invention.

Turning now to FIGS. 7 and 8, the circuit board 60 is fastened to the chassis 50 and locked into place by retainers 32. As described with reference to FIG. 2 above, the retainers 32 may have retainer feet 36 and retainer tabs 38 to secure the retainer 32 to predetermined locations on the chassis 50. The retainer body 34 may support a portion of the circuit board 60. The retaining body 34 may impart additional structural stability to the circuit board 60. The board retainer 40 may secure the circuit board 60 against the spring tension in the fasteners 10.

During installation of the circuit board 60 onto the chassis 50, the board retainer 40 may be slightly depressed. Holes 62 in the circuit board 60 are located over the heads 22 of the fasteners 10. The circuit board 60 may then be moved toward the rear panel 52. When the circuit board 60 is properly located, the board retainer 40 may return to its original position and contact the circuit board 60. As a result, the board retainer 40 may restrict movement of the circuit board 60 caused by spring tension in the fasteners 10. Conversely, the circuit board 60 may be removed from the chassis 50 by depressing the board retainer 40, thereby releasing the tension in the fasteners 10 and allowing the circuit board 60 to be moved rearward.

Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A fastener for attaching a circuit board to a chassis comprising:
   a body having an upper end and a lower end;
   a generally-triangular, generally rigid head section disposed at the upper end of the body, having an upper end having a guide disposed thereon and a lower end having a hook disposed thereon in fixed relationship to the body for engaging the circuit board;
   a tail section disposed at the lower end of the body for engaging the chassis; and
   a spring section to urge the head into engagement with the circuit board.

2. The fastener of claim 1, wherein the head section the tail section and the spring section are included in one piece.

3. The fastener of claim 1, wherein the tail section includes a fulcrum in pivotal engagement with the chassis.

4. The fastener of claim 1, further comprising a grounding arm.

5. The fastener of claim 4, wherein the grounding arm further comprises a foot that electrically contacts the chassis.

6. The fastener of claim 1, further comprising a fastener stop to hold the fastener generally upright when the fastener is disengaged from the circuit board.

7. The fastener of claim 1, wherein the fastener comprises die-stamped steel.

8. The fastener of claim 1, wherein the fastener comprises plastic.

9. The fastener of claim 1, wherein the fastener electrically connects the circuit board to the chassis.

10. A method for attaching a circuit board having an upper surface having a principal plane and one or more circuit board mounting holes to a chassis, the method comprising the steps of:
    positioning one or more pivoting fasteners within the chassis, each of the one or more pivoting fasteners having a generally-rigid head section having a hook, a body, a tail section, and a spring section disposed to pivot the body and head section relative to the chassis;
    connecting the tail section of the one or more pivoting fasteners to the chassis;
    pivoting the head section and body of one or more pivoting fasteners about an axis parallel to the principal plane of the circuit board and in a direction to load the spring section against the chassis;
    engaging one or more circuit board mounting holes with the head sections of the one or more pivoting fasteners; and
    freeing the head section and body of one or more pivoting fasteners to pivot the hooks into engagement with the upper surface of the circuit board, thereby locking releasably the circuit board to the chassis.

11. The method of claim 10, wherein the step of releasably locking the circuit board to the chassis is accomplished using a retainer.

12. The method of claim 10, further comprising the step of electrically connecting the circuit board to the chassis.

13. The method of claim 10, wherein the pivoting fastener electrically connects the circuit board to the chassis.

14. The method of claim 10, wherein the head section the tail section and the spring section of the one or more pivoting fastener are included in one piece.

15. A system for attaching a circuit board to a chassis comprising:
    one or more pivoting fasteners connected to the chassis and disposed to pivot against a spring in a common first direction and having hooks disposed in a common second direction opposite the common first direction to engage edges of the circuit board facing the common first direction; and
    a retainer having a retractable portion disposed to retract into the retainer selectively engaging an edge of the circuit board facing the common first direction.

16. The system of claim 15, wherein the one or more pivoting fasteners are aligned to mounting holes in the circuit board.

17. The system of claim 15, wherein the one or more pivoting fasteners are die-stamped steel.

18. The system of claim 15, wherein the one or more pivoting fasteners are formed of substantially different materials.

19. The system of claim 15, wherein the retainer is configured to work in combination with the one or more pivoting fasteners to releasably hold the circuit board.

20. The system of claim 15, wherein the one or more pivoting fasteners electrically connect the chassis to the circuit board.

* * * * *